United States Patent
Yi et al.

(10) Patent No.: US 11,133,647 B2
(45) Date of Patent: Sep. 28, 2021

(54) IMPEDANCE MATCHING CIRCUIT FOR OPTICAL TRANSMITTERS AND METHODS OF MAKING AND USING THE SAME

(71) Applicant: Source Photonics (Chengdu) Company, Ltd., Chengdu (CN)

(72) Inventors: Li Yi, Chengdu (CN); Yuanjun Huang, Chengdu (CN)

(73) Assignee: Source Photonics (Chengdu) Company, Ltd., Chengdu (CN)

( * ) Notice: Subject to any disclaimer, the term of this patent is extended or adjusted under 35 U.S.C. 154(b) by 494 days.

(21) Appl. No.: 16/304,601

(22) PCT Filed: Sep. 20, 2018

(86) PCT No.: PCT/CN2018/106818
§ 371 (c)(1),
(2) Date: Nov. 26, 2018

(87) PCT Pub. No.: WO2020/056699
PCT Pub. Date: Mar. 26, 2020

(65) Prior Publication Data
US 2021/0226413 A1     Jul. 22, 2021

(51) Int. Cl.
*H01S 5/042* (2006.01)
*H01S 5/024* (2006.01)
(Continued)

(52) U.S. Cl.
CPC .......... *H01S 5/0427* (2013.01); *H01S 5/0261* (2013.01); *H01S 5/02212* (2013.01); *H01S 5/02415* (2013.01); *H04B 10/504* (2013.01)

(58) Field of Classification Search
CPC .. H01S 5/0427; H01S 5/0261; H01S 5/02212; H01S 5/02415; H04B 10/504
See application file for complete search history.

(56) References Cited

U.S. PATENT DOCUMENTS

2006/0171431 A1*   8/2006   Kan ..................... H01S 5/042
                                                 372/38.1
2014/0376582 A1*   12/2014   Kao ..................... H01S 5/0427
                                                 372/38.01
(Continued)

FOREIGN PATENT DOCUMENTS

| CN | 101043122 A | 9/2007 |
|---|---|---|
| CN | 102638314 A | 8/2012 |
| CN | 103050887 A | 4/2013 |

OTHER PUBLICATIONS

International Search Report and Written Opinion dated Jun. 19, 2019; International Application No. PCT/CN2018/106818; International Filing Date Sep. 20, 2018; 9 pgs.; National Intellectual Property Administration, PRC (ISA/CN); Beijing, China.

*Primary Examiner* — Yuanda Zhang
(74) *Attorney, Agent, or Firm* — Central California IP Group, P.C.; Andrew D. Fortney

(57) ABSTRACT

Embodiments of the disclosure pertain to an optical transmitter comprising a laser configured to generate an optical signal from a single-ended electrical signal, a housing or (sub)assembly containing the laser, a driver configured to generate the single-ended electrical signal, a direct current (DC) return path, and an alternating current (AC) return path. The laser has a DC power pin, and the DC power has a DC component and an AC component. The driver has a first impedance at a first output through which the single-ended electrical signal passes. The housing or (sub)assembly has a second impedance matching the first impedance. The DC return path comprises an inductor and is configured to carry or conduct the DC component of the DC power from the laser (e.g., to an input pin on the driver). The AC return path is configured to carry or conduct the AC component of the DC power from the laser. Methods of using and manufacturing the same are also disclosed.

20 Claims, 5 Drawing Sheets

(51) Int. Cl.
*H04B 10/50* (2013.01)
*H01S 5/026* (2006.01)
*H01S 5/02212* (2021.01)

(56) References Cited

U.S. PATENT DOCUMENTS

2016/0191196 A1 6/2016 Troiani et al.
2016/0372888 A1 12/2016 Tan et al.
2017/0207857 A1* 7/2017 Uemura ................ H01S 5/0427

* cited by examiner

IMPEDANCE MATCHING CIRCUIT FOR OPTICAL TRANSMITTERS AND METHODS OF MAKING AND USING THE SAME

FIELD OF THE INVENTION

The present invention relates to the field of optical or optoelectronic transmitters, and particularly to circuits (e.g., a laser driver) configured to drive a laser or laser diode.

DISCUSSION OF THE BACKGROUND

Optical or optoelectronic transceivers (which may be generally identified as "optical transceivers") convert electrical signals into optical signals and optical signals into electrical signals. An optical transceiver may include receiver and transmitter optical subassemblies, functional circuits, and electrical and optical interfaces, and are significant components in optical fiber communication systems and data storage networks.

FIG. 1 shows an example of a conventional optical transceiver 100. The optical transceiver 100 is connected to a host device 160 (e.g., a switchboard or router) and an optical network 170 (e.g., using optical fibers or fiber optic cables). The transceiver 100 includes (i) a transmitter 110 comprising a laser driver 112, a laser diode 114, a monitoring photodiode 116, and a bias current or voltage source 118, and (ii) a receiver 120 comprising a photodiode 122, a transimpedance amplifier 124 and a limiting amplifier 126. The transceiver 100 also includes a connector or electrical interface 130, an analog-to-digital converter 140, and a microcontroller 150.

A transmitter optical subassembly (TOSA) in the transmitter 110 includes the laser diode 114, configured to output a continuous light beam in response to an electrical signal 113 from the laser driver 112. A problem arises when the input impedance of the electrical load (i.e., of the laser diode 114 and/or the input pins on the corresponding chip) does not match the output impedance of the electrical signal source (the laser driver 112 and/or the output pins on the corresponding integrated circuit [IC]). Laser drivers having driver signal output pins with 100 Ω impedance are widely available and inexpensive.

FIG. 2 shows a conventional optical transmitter including a laser driver IC 200 including an amplifier 210, input pins 201 and 202 receiving a differential electrical input signal IN/INB from the host device 160 (see FIG. 1), and output pins 235 and 245 providing a differential driver signal at the transmission line 225A-B to a laser diode 220. The laser driver IC 200 has a total impedance at the differential signal output pins 235-245 of 100Ω and the laser diode 220 (e.g., an electrically modulated laser, or EML) has a matching impedance of 100Ω across the terminals or pins receiving the differential signal 225A-B. Currently, if an output impedance other than 100Ω is desired for the output pins 235-245 of the laser driver IC 200, one must design and manufacture a customized laser driver IC having a different output impedance.

The amplifier 210 includes a first terminal 212 and a second terminal 214 respectively connected to the I/O pins 201 and 202. The capacitors C1 and C2 are configured to filter the differential input signal IN/INB and have a capacitance of 0.1 µf in one example. The differential input signal IN/INB at the I/O pins 201 and 202 generally comprises a serial data signal.

LC circuits 230 and 240 each respectively include a capacitor 236 and 246, and inductors 232, 234 and 242, 244.

The LC circuits 230 and 240 are configured to filter the differential electrical signal from the amplifier 210 that is provided to the laser diode 220 on the transmission lines 225A-B.

External RLC circuits 250, 260, 270 and 280 respectively include resistors R3, R4, R1 and R2 connected in parallel with inductors L3, L4, L1 and L2 and capacitors C5, C6, C3 and C4 connected in series with the corresponding resistor and inductor. In one example, the capacitors C3, C4, C5 and C6 each have a capacitance of 1 µF, the inductors L1, L2, L3 and L4 each have an inductance of 47 µH, and the resistors R1, R2, R3 and R4 each have a resistance of 330Ω. The RLC circuits 250, 260 270, and 280 are connected to I/O pins 255, 265, 275 and 285, respectively. The RLC circuits 250, 260, 270 and 280 effectively block any alternating current (AC) signals or signal components from leaving or exiting the driver IC 200 through the pins 255, 265, 275 and 285. For example, the inductor 232 and the RLC circuit 250 together provide a bias signal that blocks any AC signal on the trace 215 from being output at the pin 235. As a result, the RLC circuits 250, 260, 270 and 280 may function as "choke" circuits. The terminals 257 and 267 of the respective RLC circuits 250 and 260 and the terminal 277 of the RLC circuit 270 may be coupled to the same or different power supplies, and effectively provide power to the chip 210 or the laser 220.

First and second control signals (e.g., from the microcontroller 150 in FIG. 1) are received at the input pins 211 and 213 to control the gain and the peak output voltage of the amplifier 210, respectively. A bias current or voltage is received at pin 271 and provided to the amplifier 210. A third control signal defining the cross-point of the amplifier 210 is received at pin 215 and provided to the amplifier 210. A fourth control signal corresponding to overshoot/undershoot limits for the laser diode output power is received at pin 217. The overshoot/undershoot control signal respectively decreases and increases (and thus effectively controls) the gain of the amplifier 210 when the laser diode output power is too high or too low. A fifth control signal that controls the total current through the RLC circuits 250 and 270 is received at pin 219.

The laser diode 220 is connected to the differential transmission line 225A-B. The laser diode 220 outputs an optical signal 221 in response to the signal from the laser driver IC 200. The laser diode 220 also has separate power supply and ground pins/connections (not shown). Since each of the transmission lines 225A-B has an impedance of 50Ω, and the LD 220 has an impedance of 100Ω, the impedances match, and power can be transferred from the laser driver IC 200 to the laser diode 220 with maximum efficiency.

The direct current (DC) power flow from the laser driver IC 200 to the laser diode 220 and from the laser diode 220 back to the laser driver IC 200 begins at pin 265 (e.g., from or through the RLC circuit 260), through the inductor 234, the output pin 235, the transmission line 225A, and the laser diode 220, then back from the laser diode 220 through the transmission line 225B, the pin 245, the inductor 244, the RLC circuit 280, then to the current sink 272 through pin 273. (The pin 271 may be connected to an external current sink, bias and/or current mirror configured to control the current sink 272.) Since the current flow is continuous and relatively high during optical signal transmission, there is a need to reduce the DC power flow through the laser driver IC 200, the laser diode 220, and the electrical signal paths between the laser driver IC 200 and the laser diode 220.

To decrease power consumption, device and system complexity and/or device sizes in optical networks and storage systems, it may be desirable to use small, low-power, less complex lasers such as directly modulated lasers (DMLs). However, DML chips and/or the packages in which they come typically (if not exclusively) have input impedances of only 50Ω. When the laser driver 200 has an output impedance of 100Ω at the pins providing the differential electrical signal to the laser diode, but the DML chip 220 has an input impedance of 50Ω at the input pin(s) configured to receive the differential electrical signal from the laser driver 200, the electrical load has a lower impedance than the electrical source, efficiency of power transmission to the laser diode 220 is not maximized, and signal reflection back to the laser driver 200 is not minimized. It may be costly and/or difficult to re-design the laser diode chip 200 or the package in which it is housed to increase the input impedance to 100Ω or to decrease the output impedance of the laser driver 200 to 50Ω.

Also, the packages that house DML chips are generally too small to include a thermoelectric cooler (TEC). As a result, excess heat may accumulate in the DML chip if the DML chip operates continuously for a long period of time, and such excess heat may cause the wavelength of the output optical signal to change or drift. Additionally, it may be necessary to shut down the DML chip if its temperature exceeds a predetermined threshold (e.g., 80-85° C.).

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

In one aspect, the present invention relates to an optical transmitter. The optical transmitter may comprise (1) a laser configured to generate an optical signal from a single-ended electrical signal, (2) a housing or (sub)assembly containing the laser, (3) a driver configured to generate the single-ended electrical signal, (4) a direct current (DC) return path, and (5) an AC return path. The laser has a DC power pin, and the DC power has a DC component and an AC component. The driver has a first impedance at a first output through which the single-ended electrical signal passes. The housing or (sub)assembly has a second impedance matching the first impedance. The DC return path is configured to carry or conduct the DC component of the DC power from the laser. The DC return path may further comprise an input pin on the driver configured to receive the DC component of the DC power from the inductor. The AC return path is configured to carry or conduct the AC component of the DC power from the laser.

In some embodiments, the first and second impedances have the same predetermined value. In other or further embodiments, the laser may comprise a directly modulated laser, and the housing or (sub)assembly may comprise a transistor outline package (TO).

In some embodiments, the driver may be configured to generate a differential electrical signal comprising the single-ended electrical signal and a complementary electrical signal. The driver may further comprise a second output through which the complementary electrical signal passes. The second output may be coupled to a terminal impedance (e.g., a same or different ground potential).

In some embodiments, the optical transmitter may further comprise a thermo-electric cooler (TEC) in the housing or (sub)assembly, configured to cool the laser. The TEC may be thermally connected to the laser by a metal plate or thermal contact layer (e.g., of a metal or metal alloy comprising copper and/or aluminum).

In some embodiments, the DC return path may further comprise a first filter configured to adjust an impedance of the inductor such that the impedance of the inductor blocks substantially all of the AC component of the DC power from the DC return path. Alternatively or additionally, the filter may reduce or remove a residual AC component from the DC component of the DC power. The first filter may be or comprise one or more ferrite beads (e.g., a ferrite bead filter, which may be magnetized) or any other filter configured to reduce or remove an AC component from a current. In other or further embodiments, the driver further comprises a current sink or current source in electrical communication with the input pin receiving the DC component of the DC power from the DC return path (e.g., the inductor and/or filter in the DC return path).

In another aspect, the present invention relates to a method of transmitting an optical signal. The method may comprise (1) generating a single-ended electrical signal using a driver, (2) converting the single-ended electrical signal to the optical signal using a laser in a housing or assembly, (3) outputting DC power from the laser, the DC power having a direct current (DC) component and an alternating current (AC) component, (4) carrying or conducting the DC component of the DC power from the laser on a DC return path comprising an inductor, and (5) carrying or conducting the AC component of the DC power from the laser on an AC return path comprising a first capacitor having a first electrode coupled to the laser and a second electrode coupled to a first ground potential. The driver has a first impedance at a first output through which the single-ended electrical signal passes. The housing or assembly has a second impedance matching the first impedance. The method may further comprise sinking or sourcing the DC component of the DC power (e.g., on the driver, to close the DC power return loop).

As for the optical transmitter, the first and second impedances may have the same predetermined value, the laser may comprise a directly modulated laser, and/or the housing or (sub)assembly may comprise a transistor outline package (TO).

In some embodiments, the method may comprise amplifying and/or outputting a differential electrical signal comprising the single-ended electrical signal and a complementary electrical signal, and coupling the complementary electrical signal to a terminal impedance (e.g., a second ground potential) through a second output of the driver.

In some embodiments, the method may further comprise cooling the laser with a thermo-electric cooler (TEC) in the housing or assembly. For example, cooling the laser may comprise transferring thermal energy from the laser using a metal plate or thermal contact layer (e.g., comprising copper and/or aluminum).

In some embodiments, the method may further comprise (i) adjusting an impedance of the inductor such that the impedance of the inductor blocks substantially all of the AC component of the DC power from the DC return path and/or (ii) reducing or removing a residual AC component from the DC component of the current using a filter. The filter may be as described for the optical transmitter.

In yet another aspect, the present invention relates to a method of manufacturing an optical transmitter. The method may comprise (1) configuring a driver to output a single-ended electrical signal through a first output, (2) securing a laser in a housing or assembly, (3) forming a direct current (DC) return path, and (4) forming an alternating current (AC) return path. As for the present optical transmitter, the driver has a first impedance at the first output. The housing or assembly has a second impedance matching the first impedance. The laser is configured to convert the single-ended electrical signal to an optical signal and to output DC power. The DC power has a DC component and an AC component. The DC return path comprises a first inductor and is configured to carry or conduct the DC component of the DC power from the laser. The AC return path comprises a first capacitor having a first electrode coupled to the laser and a second electrode coupled to a first ground potential, and is configured to carry or conduct the AC component of the DC power from the laser.

In some embodiments, the method further comprises securing a thermo-electric cooler (TEC) in the housing or (sub)assembly. The TEC may be configured to cool the laser, the laser may comprise a directly modulated laser, and the housing or assembly may comprise a transistor outline package (TO).

The present invention advantageously matches the impedance of a laser (e.g., laser diode) to the impedance of a current source (e.g., a laser driver integrated circuit), thus maximizing power output at the laser and minimizing the reflection of current back to the current source. These and other features and advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures and components have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "transceiver," "optical transceiver" and "optoelectronic transceiver" may be used interchangeably, as may the terms "optical" and "optoelectronic," the terms "connected to," "coupled with," "coupled to," and "in communication with" (which include both direct and indirect connections, couplings and communications), the terms "mounting," "affixing," "attaching" and "securing" (and grammatical variations thereof), the terms "data," "information" and "bit(s)," and the terms "package," "housing," "assembly," and "subassembly," but these terms are generally given their art-recognized meanings. The term "(sub)assembly" refers to an assembly and/or subassembly.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases (e.g., cylindrical structures such as optical fibers and certain other optical waveguides). A "major surface" refers to a surface defined by the two largest dimensions of a given structure or feature, which in the case of a structure or feature having a partially or completely circular or spherical surface, may be defined by the radius of the circle or sphere.

Figure 3:
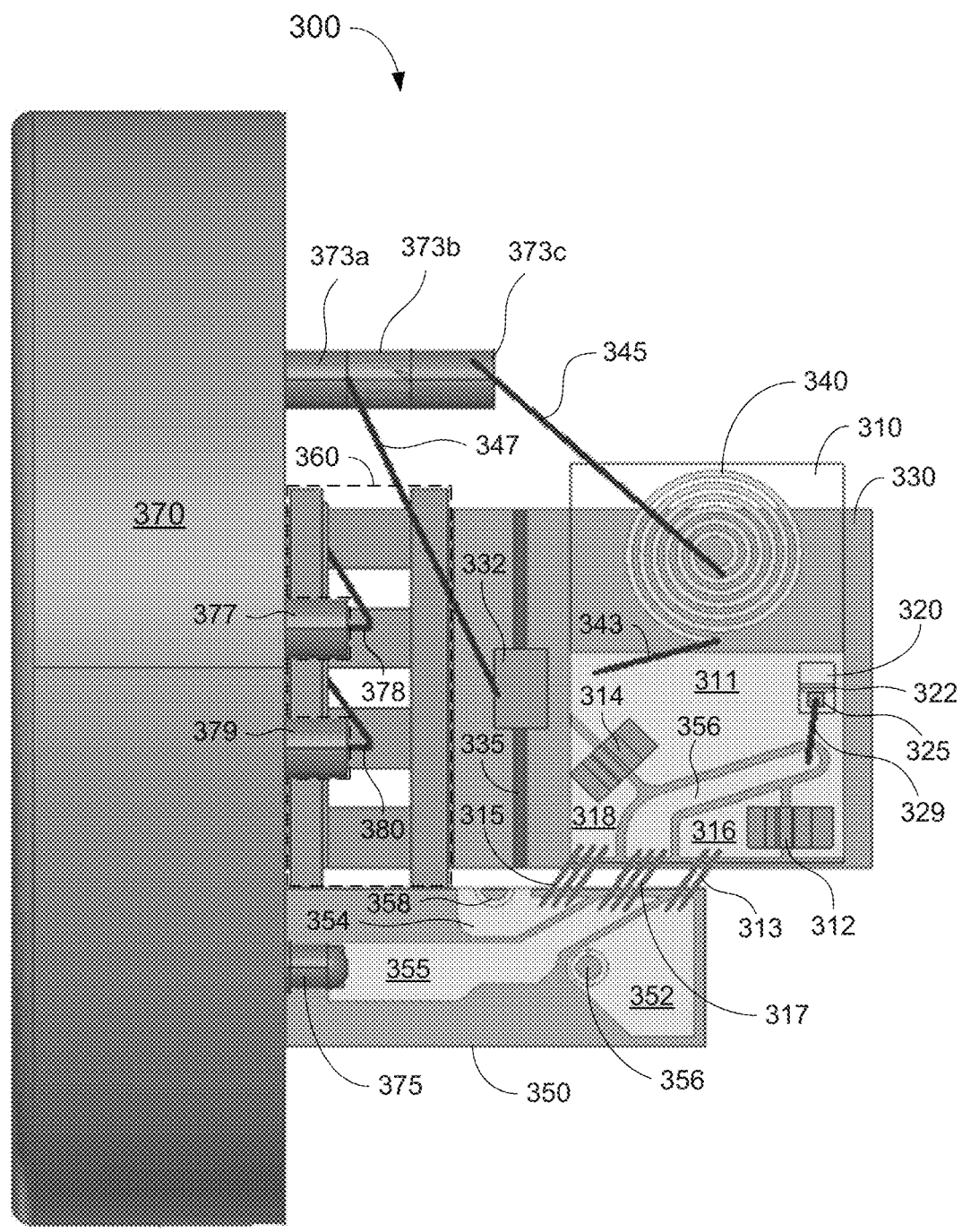
FIG. 3 shows an exemplary transmitter optical subassembly (TOSA) including a directly modulated laser (DML) in a transistor outline package in accordance with one or more embodiments of the present invention.

FIG. 3 shows an exemplary transmitter optical subassembly (TOSA) 300 comprising a first substrate 310 with a metal plate or layer 311 thereon, capacitor plates 312 and 314, complementary capacitor plates 316 and 318, a second substrate 320 with a laser diode (LD) 322 thereon, a bond pad 325 electrically connected to the laser diode 322 with a wire bond 329 connecting the laser diode 322 to a transmission plate or layer 356, a third substrate 330 with a metal layer or coating thereon, a monitoring photodiode 332 mounted on or secured to (but also insulated from) the third substrate 330, an insulated trace 335 on the third substrate 330, an inductor 340 on the first substrate 310, a fourth substrate 350 with ground plane sections 352 and 354 thereon, a transmission plate or layer 355, a thermoelectric cooler (TEC) 360 in thermal communication with the metal layer or coating on the third substrate 330, input and/or output pins 373a-c and 375, TEC power pins 377 and 379, and wire bonds 313, 315, 317, 343, 345, 347, 378 and 380. The pins 373a-c, 375, 377 and 379 may be electrically connected and/or bonded to traces on a flexible printed circuit board ("flex PCB"), the traces of which generally route signals from various high-modulus (e.g., inflexible or stiff) PCBs, packaged components and/or discrete components to one another. The view of the TOSA 300 is a layout view of each of the first through fourth substrates 310, 320, 330 and 350. However, the TOSA 300 may include additional substrates (not shown) with additional components thereon.

A single-ended electrical signal (e.g., from the external laser driver IC 400 shown in FIG. 4) on the input pin 375 may be transferred to the transmission plate or layer 355

(e.g., via a wire bond or direct connection, not shown), then to the transmission plate or layer 356 via the wire bond 317, and then to the laser diode 322 via the wire bond 329 and the bond pad 325. The laser diode 322 may be a directly modulated laser (DML) or any other laser diode capable of outputting a modulated optical signal from a single-ended driver signal. The laser diode 322 is also electrically connected to the metal plate or layer 311. The metal plate or layer 311 may comprise a metal or metal alloy such as copper or aluminum, and may conduct electricity from the LD 322 to the capacitor plates 312 and 314 and to the inductor 340. The electricity conducted via the metal plate or layer 311 may include both a direct current (DC) component and an alternating current (AC) component. To provide a path for the DC power back to the laser driver IC 400, the DC component of the DC power from the LD 322 is transmitted via a DC return path and the AC component of the DC power from the LD 322 is transmitted via a separate AC return path. The DC power is conducted from the LS 322 in the form of a current.

The DC component of the DC power from the LD 322 is transmitted to the inductor 340 from the metal plate or layer 311 via the wire bond 343, and then via the wire bond 345 to the output pin 373c. The inductor 340 effectively provides an impedance to block the AC current from the LD 322 from passing through to the DC return path. The inductor 340 may also provide or contribute to an impedance at the output pin 373c (e.g., to any reflected or returning current or signal). The DC component of the DC power from the LD 322 is then processed externally from the TOSA 300.

The AC component of the DC power from the LD 322 is transmitted in parallel from the metal plate or layer 311 through the capacitors formed by electrodes 312 and 314 and complementary electrodes 316 and 318 respectively capacitively coupled thereto. There is a layer of insulating material or air between the electrodes 312 and 314 and the complementary electrodes 316 and 318. The capacitors 312/316 and 314/318 effectively couple the AC component of the DC power from the LD 322 to a ground potential. Each of the capacitors may have a capacitance of from 100 pF to 1 µF, or any value or range of values therein, and the capacitance of the capacitor 312/316 capacitance may be the same as or different from the capacitance of the capacitor 314/318. In general, the impedance of the AC return path is small relative to the impedance of the DC return path. For example, the impedance of the AC return path may be 10% or less of the impedance of the DC return path. Optimally, the impedance of the AC return path is minimized.

The present invention is not limited to two capacitors in parallel in the AC return path. For example, the AC return path may include one capacitor, three capacitors in parallel and/or in series, four capacitors in parallel and/or in series, or any other arrangement of capacitors providing the desired ground coupling characteristics for the AC component of the DC power and/or a total capacitance of from about 200 pF to about 2 µf.

The AC component of the current from the LD 322 is then transmitted in parallel via the wire bonds 313 and 315 to the ground plane sections 352 and 354. The ground plane sections 352 and 354 are connected to a separate TOSA ground plane (not shown) by vias 356 and 358, respectively. By including DC and AC return paths for the DC power from the LD 322, DC current (e.g., from the laser driver IC 400) can loop back from the LD 322 to the laser driver IC 400, and a bias voltage or bias current can be provided to the LD 322 (which otherwise may not be able to receive a bias voltage or current).

Figure 1:
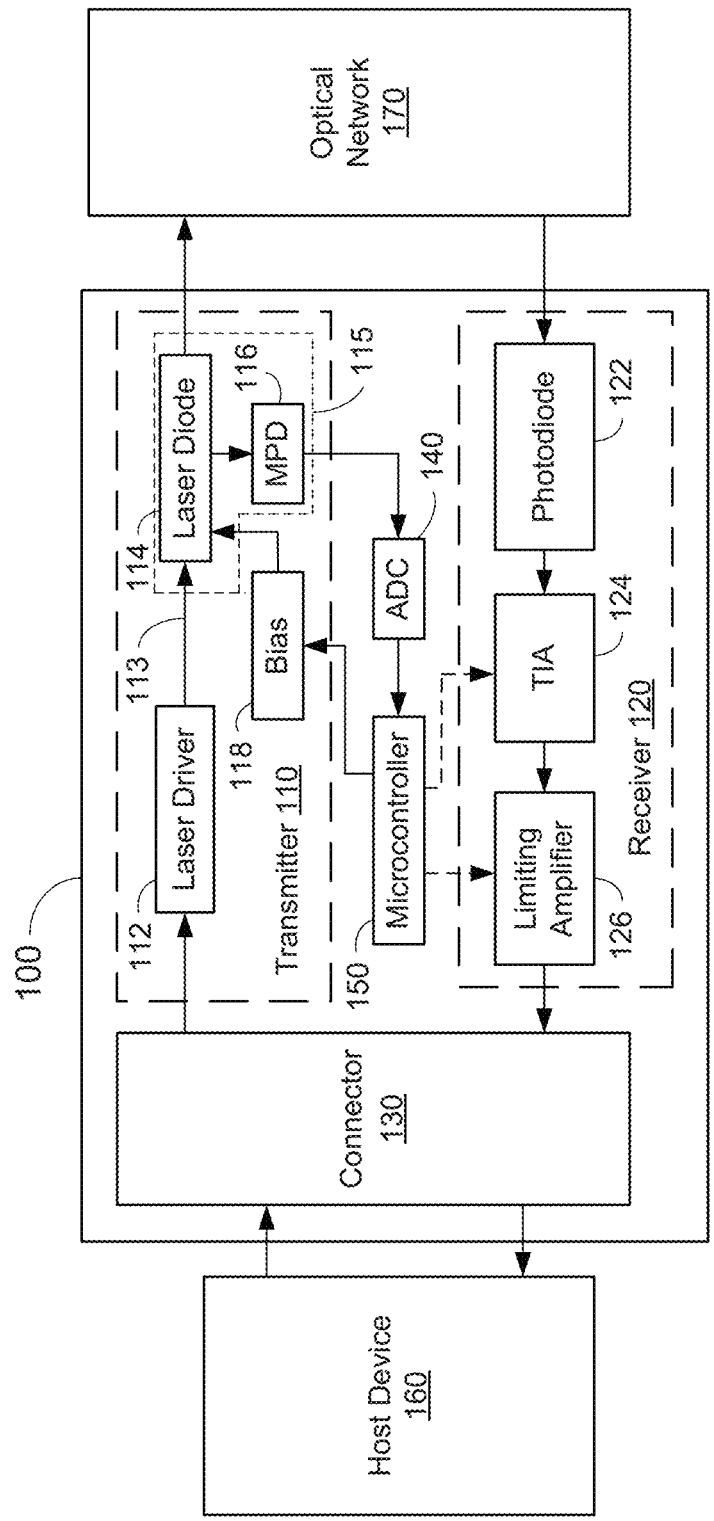
FIG. 1 shows a conventional optical transceiver.

The monitoring photodiode 332 receives a portion of the modulated optical signal emitted from the LD 322 and converts the received portion to an electrical signal that is used for monitoring the output power of the laser diode 322 (e.g., a monitoring signal). The monitoring photodiode 332 sends the monitoring signal to a microcontroller (e.g., microcontroller 150 in FIG. 1) via the wire bond 347 and the output pin 373a. In the case of a differential monitoring signal, a second wire bond (not shown) may be connected between the monitoring photodiode 332 and the pin 373b for the complementary component of the differential signal. The monitoring signal is analyzed in real-time (as the LD 322 operates) by the microcontroller 150 to monitor the power (and optionally the frequency) of the modulated optical signal. If the power or frequency is too high or too low, the single-ended electrical signal supplied from the laser drive IC 400 may be adjusted automatically to change the power or frequency closer to the predetermined or target value.

The TOSA 300 includes a transistor outline package (TO) base 370. The TO package of which the base 370 is a component may be used in certain conventional TOSAs that include an EML receiving a single-ended laser driver signal. The TO base 370 may include a surface for attaching and securing the TEC 360. The TEC power pins 377 and 379 may extend through the TO base 370 and provide a supply voltage and ground potential to the TEC 360 via the wire bonds 378 and 380. The metal layer or coating on the third substrate 330 is thermally connected to both the TEC 360 and the LD 322. Thus, the TEC 360 can actively cool the LD 322 using the metal layer or coating on the third substrate 330 to conduct excess heat away from the LD 322.

Figure 2:
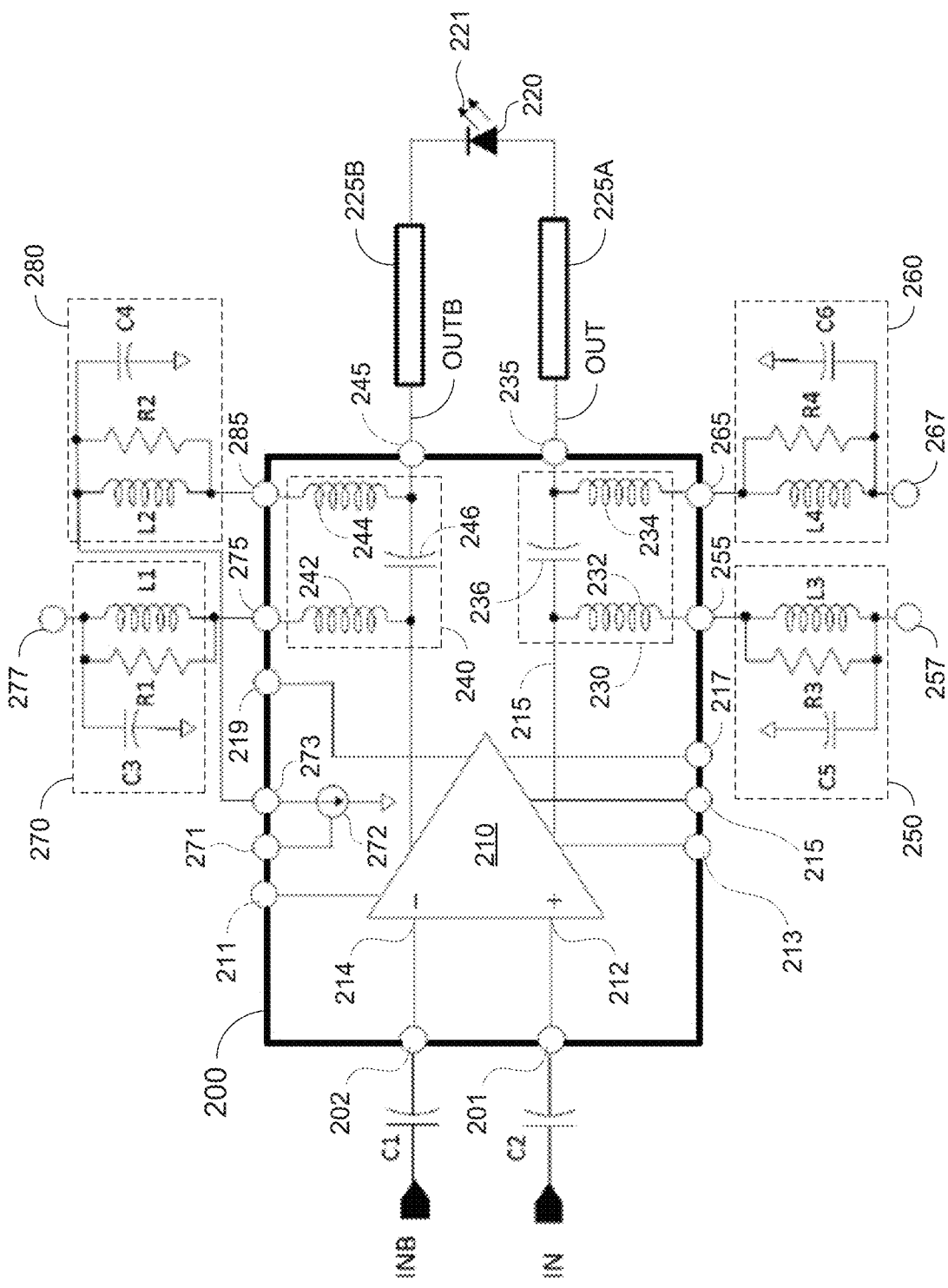
FIG. 2 shows conventional transmitter circuit including a conventional laser driver IC.

Although the problem of cooling a DML is solved by the TO package (or other package or housing enabling impedance matching with the laser driver IC) of which the TOSA 300 is a part, a DC current (e.g., from a conventional laser driver) cannot be used with the LD 322 in the TO package. In the conventional optical transmitter of FIG. 2, the laser driver 210 includes an LD+ pin and an LD− pin 273. The DC current from the laser diode 220 returns to the LD− pin 273 on a trace from the RLC circuit 280 to the LD− pin 273. In standard TO packages, there is no pin for returning the DC current from the laser diode 220, as there is only one pin in the TO package for DC current between the driver 200 and the laser diode 220. The pin in the TO package that would provide a return path for the DC current (and which would correspond to the LD− pin) is connected to ground. However, DC power from the laser diode 220 must be returned to the laser driver 200 at the LD− pin 273. Likewise, the AC signal from the laser diode 220 must be returned to a ground potential (e.g., to which some or all of the driver chip 200 is grounded). Thus, in at least one respect, the DC return path is separated from the AC path to ground by an AC capacitance (e.g., capacitors 312/316 and 314/318) and/or an inductance (e.g., inductor 340).

Figure 4:
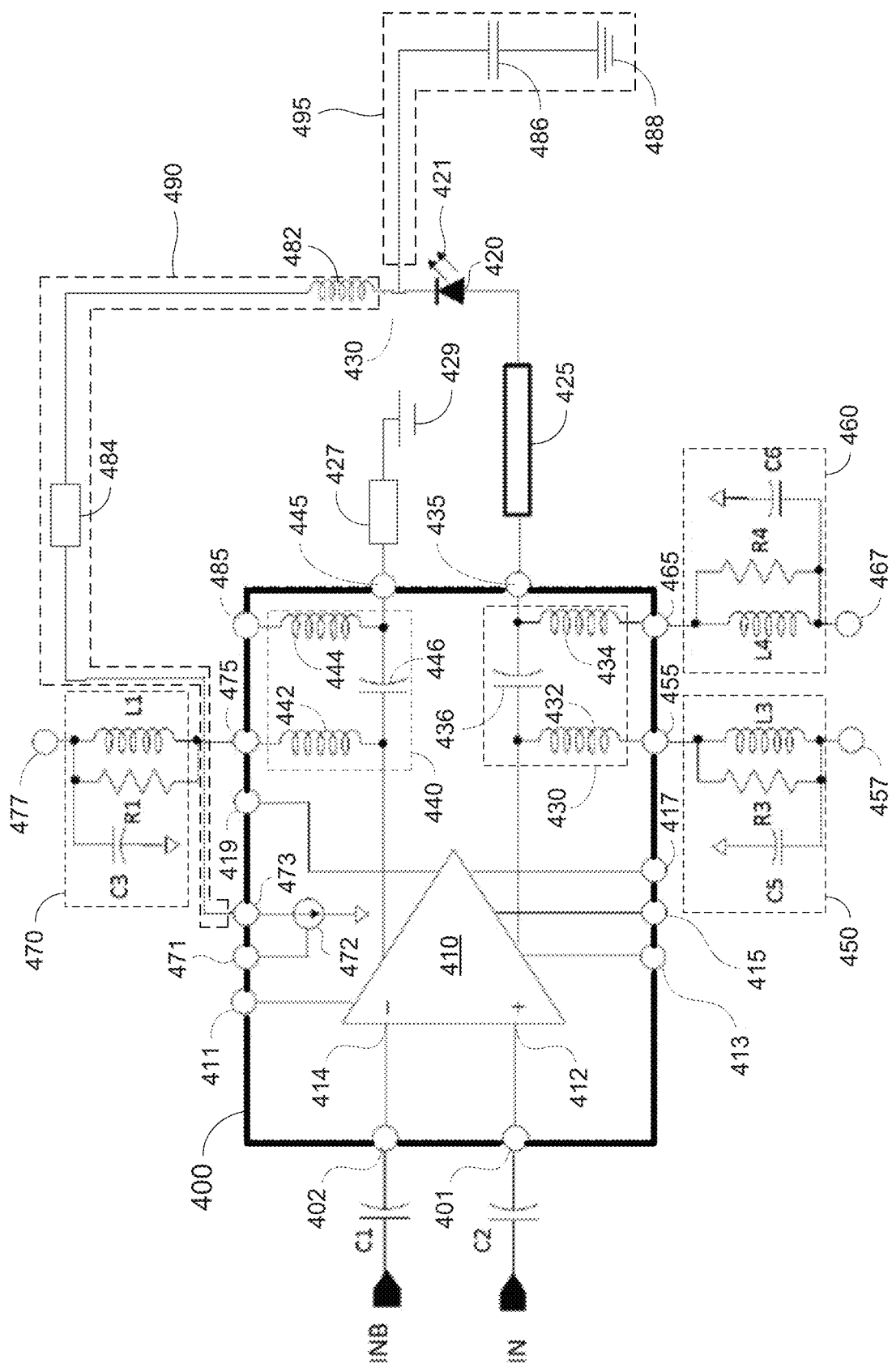
FIG. 4 shows an exemplary optical transmitter including a DML with separate AC and DC current paths in accordance with one or more embodiments of the present invention.

FIG. 4 shows an exemplary optical transmitter including a laser driver IC 400, a laser diode 420, and RLC circuits 450, 460, and 470. The laser driver IC 400 includes an amplifier 410, input pins 401 and 402 receiving a differential input signal IN/INB from a host device, an output pin 435 providing a single-ended driver signal, a complementary signal output pin 445, LC circuits 430 and 440, and a current sink 472. The laser driver IC 400 may be identical to or substantially the same as laser driver IC 200 in FIG. 2. The laser diode 420 outputs an optical signal 421 in response to the single-ended signal from the laser driver IC 400.

The single-ended driver signal output through the pin 435 on a transmission line 425 is transmitted to the laser diode chip 420 (e.g., through a pin in the package or housing enclosing the laser diode chip 420). The driver signal generally carries data (e.g., a serial data stream), but it may carry other information as well, such as overhead information, transmitter and/or transceiver identification, status and/ or operating parameter information, etc. The complementary signal output through the pin 445 on the transmission line 427 is coupled to a ground potential 429. The laser driver IC 400 has an impedance at the output pin 435 of 50Ω, and the package or housing that encloses and protects the laser diode 420 (e.g., the TO package in the TOSA 300 of FIG. 3) also has an input impedance of 50Ω at the corresponding input pin. Thus, the impedances of the laser driver IC 400 and the LD chip 420 match.

The laser driver IC 400 includes an amplifier 410 having first and second terminals 412 and 414 connected to input pins 401 and 402, respectively. Thus, the amplifier 410 may be or comprise a differential amplifier (i.e., having a differential input and a differential output). Alternatively, the amplifier 410 may be or comprise an amplifier having a differential input and a single-ended output. The first and second terminals 412 and 414 are configured to receive the differential input (e.g., a serial data) signal IN/INB (e.g., from a host device). The capacitors C1 and C2 are configured to filter the differential electrical input signal IN/INB and may be the same as the capacitors C1 and C2 in FIG. 2, although they are not required to be. For example, the capacitors C1 and C2 in FIG. 4 may each have a capacitance of 100 pF to 1 μF, or any value or range of values therein. Typically, the capacitance of each of the capacitors C1 and C2 is nominally the same.

LC circuits 430 and 440 each respectively include a capacitor 436 and 446 and inductors 432, 434 and 442, 444. The LC circuits 430 and 440 are configured to filter the differential electrical signal output from the amplifier 410 (e.g., to remove components of the signal below a predetermined minimum frequency and/or above a predetermined maximum frequency) to produce a differential driver signal at pins 435 and 445. Because the complementary signal is coupled to ground through the transmission line 427 (which forms or includes a termination impedance), the laser driver IC 400 effectively outputs a single-ended driver signal to the LD 420 on the transmission line 425.

RLC circuits 450, 460, and 470 are connected to I/O pins 455, 465, and 475, respectively. The RLC circuits 450, 460, and 470 may be on the same substrate (e.g., PCB) as the laser driver IC 400. The RLC circuit 450 includes a resistor R3 connected in parallel with an inductor L3 and a capacitor C5 connected in series with the resistor R3 and the inductor L3. The RLC circuit 460 includes a resistor R4 connected in parallel with an inductor L4 and a capacitor C6 connected in series with the resistor R4 and the inductor L4. The RLC circuit 470 includes a resistor R1 connected in parallel with an inductor L1 and a capacitor C3 connected in series with the resistor R1 and the inductor L1. The RLC circuits 450, 460 and 470 effectively block any alternating current (AC) signals or signal components from leaving or exiting the driver IC 400 through the pins 455, 465 and 475 and may define the electrical signal frequency band or frequency bands to be filtered by the LC circuits 430 and 440, although it is not necessary for the LC circuit 440 to filter the terminated complementary part of the differential signal from the amplifier 410. Thus, the LC circuit 440 and the RLC circuit 470 are optional, but advantageously included for balancing the individual outputs from the differential amplifier 410. The pin 485 may be left floating. For example, it may be bonded or electrically connected to a pad on the substrate or PCB, where the pad is not electrically connected to any other component or trace.

The terminals 457 and 467 of the respective RLC circuits 450 and 460 may be coupled to first and second power supplies, which may be related or unrelated, and which may be electrically isolated from each other. When the RLC circuit 470 is present, the terminal 477 may be coupled to a bias voltage or ground potential (e.g., a virtual ground potential).

First and second control signals (e.g., from the microcontroller 150 in FIG. 1) are received at the input pins 411 and 413 to control the gain and the peak output voltage of the amplifier 410, respectively. A bias current or voltage is received at pin 471 and is provided to the amplifier 410. A third control signal defining the cross-point of the amplifier 410 is received at pin 415 and is provided to the amplifier 410 as shown. A fourth control signal corresponding to overshoot and undershoot limits for the laser diode output power is received at pin 417. The overshoot/undershoot control signal respectively decreases and increases (and thus effectively controls) the gain of the amplifier 410 when the laser diode output power is too high or too low. A fifth control signal that controls the total current through the RLC circuit 450 and (when present) the RLC circuit 470 is received at pin 419.

Since the laser diode 420 receives a single-ended signal, the impedances of the laser driver chip 400 and the package or housing for the laser diode 420 match. A DC return path 490 transports the DC component of the current from the laser diode 420, and an AC return path 495 transports the AC component of the current from the laser diode 420. The DC return path 490 comprises at least an inductor 482 and an optional filter 484 (e.g., comprising ferrite beads). The DC current component of the current from the laser diode 420 may be used (e.g., by the driver 400 and/or a microcontroller such as microcontroller 150 in FIG. 1) to monitor the power consumed by the laser diode 420. The AC return path 495 comprises at least a capacitor 486 with a first electrode coupled to the laser diode 420 and a second electrode coupled to a first ground potential 488. The DC return path 490 and the AC return path 495 may be similar or identical to the DC return path and AC return path described with respect to FIG. 3. Additionally, the laser diode 420 may be similar or identical to the laser diode 322, and the transmission line 425 may be similar or identical to the electrical path comprising the transmission layer or plate 355, the wire bond 317, and the transmission layer or plate 356.

The inductor 482 may be similar or substantially identical to the inductor 340. The DC return path 490 is configured to allow only the DC component of the single-ended electrical signal to pass through to the driver IC 400. Thus, an optional filter 484 may be present to adjust the impedance of the inductor 482 and/or otherwise filter any residual AC current passing through the DC return path 490. The DC component of the current from the laser diode 420 then returns to a pin 473 on the driver IC 400 that is in electrical communication with a current sink 472. In alternative embodiments in which the DC power flow may be reversed, the driver IC 400 may comprise a current source coupled to a power supply and/or controlled by a bias current or voltage that is complementary to (or an inverse of) the bias current or voltage received at pin 471.

The capacitor 486 may be similar or substantially identical to the capacitor(s) shown in FIG. 3 (formed by the capacitive coupling of the plates 312 and 314 and their respective complementary plates 316 and 318). Similar to the capacitors 312/316 and 314/318 coupled to the ground plane sections 352 and 354, the capacitor 486 is connected to a ground potential 488 in FIG. 4. In some embodiments, the ground potential 488 is also coupled or connected directly or indirectly to the ground potential to which capacitors C5 and C6 in RLC circuits 450 and 460 are coupled or connected.

Figure 5:
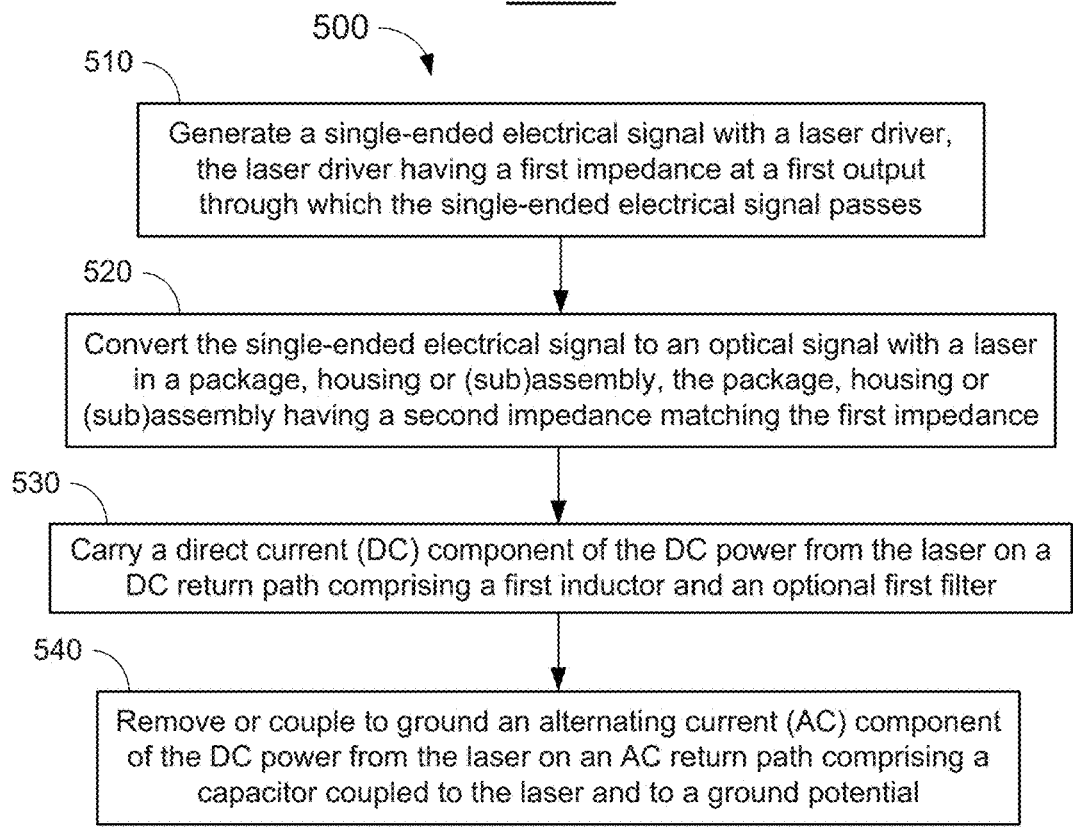
FIG. 5 is a flowchart showing an exemplary method of transmitting an optical signal in accordance with one or more embodiments of the present invention.

An Exemplary Method of Transmitting an Optical Signal Using an Impedance Matching Circuit FIG. 5 is a flow chart 500 showing an exemplary method of transmitting an optical signal using an impedance matching circuit. At 510, a single-ended electrical driver signal is generated using a laser driver. The driver signal generally carries data, but it may carry other information as well (e.g., overhead information, transmitter/transceiver status and operating parameter information, etc.). The driver may have a first impedance at a first output through which the single-ended electrical signal passes. For example, the driver may be the laser driver IC 400 described with respect to FIG. 4, and the first output may be the pin 435. The first impedance may be 50Ω, for example, but the invention is not limited thereto. For example, the first impedance may be any value of from 20 to 1000Ω (e.g., 50 to 100Ω).

At 520, the single-ended electrical signal is converted to an optical signal using a laser in a package, housing or optical subassembly. The package, housing or optical subassembly has a second impedance matching the first impedance. For example, when the first impedance is 50Ω, the second impedance may also be 50Ω. The package, housing or optical subassembly may be or comprise the TOSA 300 described with respect to FIG. 3. The laser also generates a current having a direct current (DC) component and an alternating current (AC) component.

At 530, the DC component of the DC power is transported or conducted from the laser (e.g., to the laser driver) on a DC return path. The DC return path includes at least a first inductor and an optional first filter. The DC return path may be, for example, the DC return path 490 described with respect to FIG. 4. The first inductor (e.g., the inductor 340 in FIG. 3 or the inductor 482 in FIG. 4) may provide a resistance to the DC component of the DC power (e.g., a DC current) and blocks the AC component of the DC power from being transported on the DC return path. The first filter (e.g., the filter 484 of FIG. 4) may be or comprise one or more magnetic beads, and is configured to further adjust the impedance of the first inductor and/or reduce or remove any residual AC current from the DC return path. In further embodiments, the DC return path returns the DC component of the DC power to the laser driver IC, where the DC component (e.g., a current) may be sunk (e.g., using a current sink such as current sink 472 in FIG. 4, coupled to a ground potential and/or controlled by a bias current or voltage such as the signal received at pin 471 in FIG. 4). In an alternative embodiment in which the DC power flow is reversed, the DC component of the DC power is sourced using a current source coupled to a power supply and/or controlled by a bias current or voltage that may be complementary to (or an inverse of) the signal received at pin 471 in FIG. 4.

At 540, the AC component of the DC power is removed from the laser or coupled to a ground potential on an AC return path. The AC return path may include at least a capacitor coupled to the laser and to a ground potential. For example, the capacitor may have a first electrode electrically connected to the laser and a second electrode electrically connected to the ground potential. Alternatively or additionally, the capacitor may comprise two or more capacitors in parallel, and if more than two capacitors, two or more of the capacitors may also be in series. The AC return path may be, for example, the AC return path 495 described with respect to FIG. 4. By effectively removing the AC component of the DC power that is returned to the laser driver, the DC power loop between the laser driver and the laser may be completed, without undesired power/signal transfer reflections and/or inefficiencies.

Figure 6:
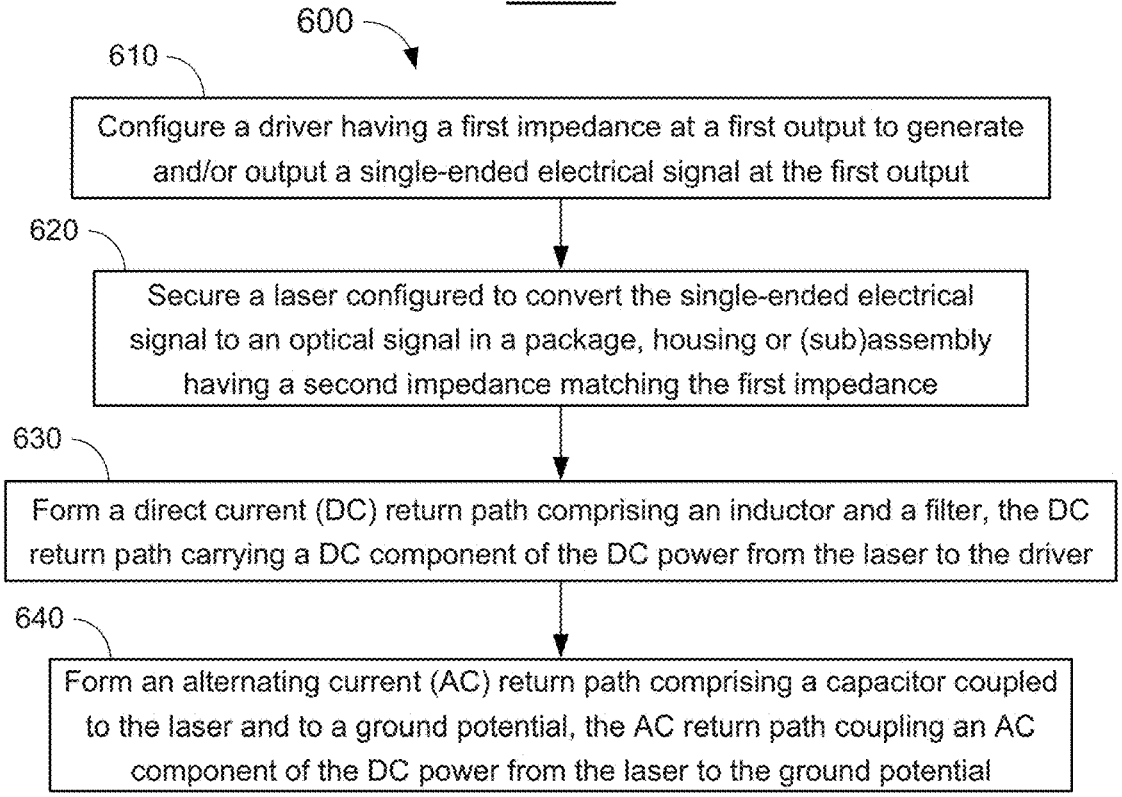
FIG. 6 is a flowchart showing an exemplary method of manufacturing an optical transmitter in accordance with one or more embodiments of the present invention.

An Exemplary Method of Manufacturing an Optical Transmitter Including an Impedance Matching Circuit FIG. 6 is a flow chart 600 showing an exemplary method of manufacturing an optical transmitter including an impedance matching circuit. At 610, a driver (e.g., the laser driver 400 in FIG. 4) is configured to generate and/or output a single-ended electrical driver signal. The driver signal generally carries serial data, but it may carry other information as well (e.g., overhead information, transmitter/transceiver identification, status and/or operating parameter information, etc.). The driver may have a first impedance at a first output through which the single-ended electrical signal passes. For example, the driver may be the laser driver IC 400 described with respect to FIG. 4, and the first output may be the pin 435. The first impedance may be 50Ω, for example, but the invention is not limited thereto. For example, the first impedance may be any value of from 20 to 1000Ω (e.g., 50 to 100Ω). In further embodiments, the driver may be mounted or otherwise bonded or attached to a substrate (e.g., to a printed circuit board) in a conventional IC bonding process.

At 620, a laser configured to convert the single-ended electrical signal to an optical signal is secured in a package or housing or on an assembly (e.g., an optical subassembly). The package, housing or (sub)assembly has a second impedance (e.g., an input impedance) matching the first impedance (e.g., of the driver at the first output). For example, when the first impedance is 50Ω, the second impedance may also be 50Ω. The package, housing or (sub)assembly may be or comprise the TOSA 300 described with respect to FIG. 3. Thus, in some embodiments, the laser may be secured to (e.g., mounted on or bonded to) a substrate that is, in turn, secured to, mounted on or bonded to a (sub)assembly, and the (sub)assembly is then placed in and secured to the package or housing. The package or housing may then be electrically connected to a further substrate (e.g., a PCB or flex PCB) by conventional techniques. The further substrate may include the driver or be electrically connected to the driver on yet another substrate (e.g., another PCB).

The laser may also contain DC power (e.g., in the form of a current) that must be carried or conducted away from the laser (e.g., to complete the power circuit to the laser). The DC power may have a DC component and an AC component.

At 630, a DC return path configured to carry or conduct the DC component of the DC power from the laser is formed. The DC return path may include at least a first inductor and a first filter. The DC return path may be, for example, the DC return path 490 described with respect to FIG. 4. The first inductor (e.g., the inductor 340 of FIG. 3) may provide a resistance to the DC component and blocks the AC component from passing through to the DC return path. The first filter (e.g., the filter 484 of FIG. 4) may comprise one or more magnetic beads configured to adjust the impedance of the inductor in the DC return path or otherwise further reduce or remove any residual AC current from the DC return path.

Forming the DC return path may comprise forming one or more traces on one or more substrates (e.g., a PCB and/or a flex PCB) electrically connecting the inductor to the DC power output pin of the laser and to an input pin of the driver IC. Optionally, forming the DC return path may further comprise mounting or securing a filter configured to adjust (e.g., increase) an impedance of the signal path to which it is coupled or connected and/or remove any AC component of the signal on the signal path, and passing the DC component of the DC power through the filter. For example, the filter may comprise one or more ferrite beads or a magnetic field generated by the ferrite bead(s).

In further embodiments, the driver is further configured to receive the DC component of the DC power at an input pin and/or sink or source the (received) DC component of the DC power. Thus, the driver may include a current sink or current source controlled by a bias voltage or bias current (e.g., having a predetermined value) that may be generated on-chip or received at another input pin.

At 640, an AC return path configured to remove the AC component of the DC power from the laser is formed. The AC return path may include at least a capacitor coupled to the laser and to a ground potential, thereby coupling the AC component of the DC power to the ground potential. The AC return path may be or comprise, for example, the AC return path 495 described with respect to FIG. 4. The capacitor (e.g., the capacitor 486) may include at least one a first electrode electrically connected to the laser and a second electrode electrically connected to the ground potential, although the invention is not limited thereto. In other or further embodiments, the capacitor may include two, three, four or more capacitors connected in parallel, and when the capacitor includes three or more capacitors, in parallel and optionally in series.

Thus, in some embodiments, forming the AC return path may comprise forming one or more capacitors and one or more connecting metal layers or traces on one or more substrates (e.g., a PCB and/or a flex PCB). The metal layers or traces electrically connect the DC power output pin of the laser to a first electrode of at least one of the one or more capacitors, and a second, complementary electrode of at least one of the one or more capacitors to a ground potential. The ground potential may be on the same substrate as or a different substrate from the one or more capacitors. Optionally, forming the AC return path may comprise the metal layers or traces and the capacitor electrodes may be formed by printing or by depositing a metal and patterning the metal. The method may further include forming a dielectric between the complementary capacitor electrodes or on a first one of the capacitor electrodes (followed by forming the second one of the capacitor electrodes on the dielectric), or it may comprise printing or patterning the capacitor electrodes so that a gap is formed between the first and second electrodes of each capacitor.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An optical transmitter, comprising:
   a laser configured to generate an optical signal from a single-ended electrical signal, the laser having a pin for outputting DC power, and the DC power having a direct current (DC) component and an alternating current (AC) component;
   a housing or (sub)assembly containing the laser;
   a driver configured to generate the single-ended electrical signal, the driver having a first impedance at a first output through which the single-ended electrical signal passes;
   a DC return path, configured to carry or conduct the DC component of the DC power from the laser, the DC return path comprising a first inductor and an input pin on the driver configured to receive the DC component of the DC power from the inductor; and
   an AC return path configured to carry or conduct the AC component of the DC power from the laser, the AC return path comprising a first capacitor having a first electrode coupled to the laser and a second electrode coupled to a first ground potential,
   wherein the housing or (sub)assembly has a second impedance matching the first impedance.

2. The optical transmitter of claim 1, wherein the first and second impedances have a same predetermined value.

3. The optical transmitter of claim 1, wherein the laser comprises a directly modulated laser.

4. The optical transmitter of claim 1, wherein the housing or (sub)assembly comprises a transistor outline package.

5. The optical transmitter of claim 1, wherein the driver is configured to generate a differential electrical signal comprising the single-ended electrical signal and a complementary electrical signal.

6. The optical transmitter of claim 5, wherein the driver further comprises a second output through which the complementary electrical signal passes, and the second output includes a terminal impedance.

7. The optical transmitter of claim 1, further comprising a thermo-electric cooler (TEC) in the housing or (sub)assembly, configured to cool the laser.

8. The optical transmitter of claim 1, wherein the DC return path further comprises a first filter configured to adjust an impedance of the inductor or reduce or remove a residual AC component from the DC component of the DC power, and the driver further comprises a current sink or current source in electrical communication with the input pin.

9. A method of transmitting an optical signal, comprising:
   generating a single-ended electrical signal using a driver, the driver having a first impedance at a first output through which the single-ended electrical signal passes;
   converting the single-ended electrical signal to the optical signal using a laser in a housing or assembly, the housing or assembly having a second impedance matching the first impedance;
   outputting DC power from the laser, the DC power having a direct current (DC) component and an alternating current (AC) component;
   carrying or conducting the DC component of the DC power from the laser on a DC return path comprising a first inductor; and
   carrying or conducting the AC component of the DC power from the laser on an AC return path comprising a first capacitor having a first electrode coupled to the laser and a second electrode coupled to a first ground potential.

10. The method of claim 9, wherein the first and second impedances have a same predetermined value.

11. The method of claim 9, wherein the laser comprises a directly modulated laser.

12. The method of claim 9, wherein the housing or assembly comprises a transistor outline package.

13. The method of claim 9, further comprising generating and/or outputting a differential electrical signal comprising the single-ended electrical signal and a complementary electrical signal, and coupling the complementary electrical signal to a terminal impedance.

14. The method of claim 9, further comprising cooling the laser with a thermo-electric cooler (TEC) in the housing or assembly.

15. The method of claim 9, further comprising adjusting an impedance of the inductor such that the impedance of the inductor blocks substantially all of the AC component of the DC power from the DC return path.

16. The method of claim 9, further comprising reducing or removing a residual AC component from the DC component of the DC power using a filter.

17. A method of manufacturing an optical transmitter, comprising:

configuring a driver to output a single-ended electrical signal through a first output, the driver having a first impedance at the first output;

securing a laser in a housing or assembly having a second impedance matching the first impedance, the laser being configured to convert the single-ended electrical signal to an optical signal and to output DC power, the DC power having a direct current (DC) component and an alternating current (AC) component;

forming a DC return path comprising a first inductor, the DC return path being configured to carry or conduct the DC component of the DC power from the laser;

forming an AC return path comprising a first capacitor having a first electrode coupled to the laser and a second electrode coupled to a first ground potential, the AC return path being configured to carry or conduct the AC component of the DC power from the laser.

18. The method of claim 17, further comprising securing a thermo-electric cooler (TEC) in the housing or (sub) assembly, wherein the TEC is configured to cool the laser.

19. The method of claim 17, wherein the laser comprises a directly modulated laser.

20. The method of claim 17, wherein the housing or assembly comprises a transistor outline package.

* * * * *